United States Patent
Shimawaki

[19]

[11] Patent Number: 5,903,018
[45] Date of Patent: *May 11, 1999

[54] BIPOLAR TRANSISTOR INCLUDING A COMPOUND SEMICONDUCTOR

[75] Inventor: Hidenori Shimawaki, Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/703,685

[22] Filed: Aug. 27, 1996

Related U.S. Application Data

[63] Continuation of application No. 08/231,299, Apr. 22, 1994, abandoned.

[30] Foreign Application Priority Data

May 20, 1993 [JP] Japan ..................................... 5-118020

[51] Int. Cl.⁶ ................. H01L 31/0328; H01L 31/0336; H01L 31/072; H01L 31/109
[52] U.S. Cl. .......................... 257/198; 257/191; 257/197; 257/592; 257/655; 257/744; 257/745
[58] Field of Search .................... 257/197, 198, 257/592, 593, 191, 655, 745

[56] References Cited

U.S. PATENT DOCUMENTS 4,518,979  5/1985  Dumke et al. .......................... 257/462
5,571,732  11/1996  Liu ............................................ 437/31

FOREIGN PATENT DOCUMENTS 3-124033  5/1991  Japan .
4-83345  3/1992  Japan .
4-83346  3/1992  Japan .

OTHER PUBLICATIONS

H. Shimawaki et al., "AlGaAs/GaAs HBTs with heavily C-doped extrinsic base layers selectively grown by MOMBE", Technical Report of IEICE, 1993, pp. 23–29.

*Primary Examiner*—Mahshid Saadat
*Assistant Examiner*—Allan R. Wilson
*Attorney, Agent, or Firm*—Young & Thompson

[57] ABSTRACT

The bipolar transistor includes an emitter layer at least a part of which is composed of AlGaAs, a collector layer at least a part of which is composed of GaAs, a base contact layer disposed in at least a part of an area between a base electrode and a base layer, and a base layer at least a part of which is composed of an InGaAs graded layer in which the concentration of In gradually increases from an emitter-base junction towards a base-collector junction.

7 Claims, 4 Drawing Sheets

BIPOLAR TRANSISTOR INCLUDING A COMPOUND SEMICONDUCTOR

This application is a continuation of application Ser. No. 08/231,299, filed Apr. 22, 1994, now abandoned.

BACKGROUND OF THE INVENTION

1. Field of the Invention

The invention relates to a bipolar transistor, and more particularly to a heterojunction bipolar transistor including a compound semiconductor therein, and also relates to a method for fabricating such a bipolar semiconductor.

2. Description of the Related Art

A bipolar transistor has advantageously a greater ability for driving electrical current than a field effect transistor (generally referred to as "FET"). For this reason, recently a bipolar transistor using therein a chemical compound semiconductor such as GaAs as well as Si has been researched and developed. In particular, a bipolar transistor using a compound semiconductor therein has many advantages, one of which is that an emitter-base junction can be constituted of a heterojunction and hence emitter injection efficiency can be maintained to be high regardless of a base having a higher density. Accordingly, such a bipolar transistor is presently being researched for driving a simplex element at a high speed, applying to various circuits and the like.

In order to achieve a higher performance of a simplex element using therein such a heterojunction bipolar transistor (hereinafter referred to as "HBT"), or a circuit to which such a simplex element is applied, it is critical to decrease a base resistance and also shorten base transit time.

It is advantageous to reduce a contact resistance in electrodes in order to reduce a base resistance. For this end, there has been suggested a method in which a heavily C-doped layer is selectively regrown in an extrinsic base area. Such a method is disclosed, for instance, in Japanese Public Disclosures Nos. 4-83345 and 4-83346 and a report authored by Shimawaki et al. by the title of "AlGaAs/GaAs HBTs with heavily C-doped extrinsic base layers selectively grown by MOMBE" reported in "The Institute of Electronics, Information and Communication Engineers" Vol. 92, No. ED 92-134, 1993, page 23.

FIG. 1 is a schematic cross-sectional view of a bipolar transistor disclosed in the above mentioned report. A semiconductor chip in FIG. 1 includes a semi-insulating substrate 1 composed of GaAs, a collector contact layer 2 ($3 * 10^{18}$ cm$^{-3}$, 500 nanometers) composed of n-GaAs, a collector layer 3a ($5 * 10^{16}$ cm$^{-3}$, 400 nanometers) composed of n-GaAs, an intrinsic base layer 5b ($4 * 10^{19}$ cm$^{-3}$, 80 nanometers) composed of p-GaAs, an emitter graded layer 6 ($3 * 10^{17}$ cm$^{-3}$, 20 nanometers) composed of n-Al$_x$Ga$_{1-x}$As (x is varied in the range of 0 to 0.25), an emitter layer 7 ($3 * 10^{17}$ cm$^{-3}$, 150 nanometers) composed of n-Al$_{0.25}$Ga$_{0.75}$As, a graded layer 8 ($3 * 10^{17}$ through $6 * 10^{18}$ cm$^{-3}$, 50 nanometers) composed of n-Al$_x$Ga$_{1-x}$As (x is varied in the range of 0.25 to 0), a n-GaAs layer 9 ($6 * 10^{18}$ cm$^{-3}$, 80 nanometers), a graded layer 10 ($2 * 10^{19}$ cm$^{-3}$, 50 nanometers) composed of n-In$_x$Ga$_{1-x}$As (x is varied in the range of 0 to 0.5), an emitter contact layer 11 ($2 * 10^{19}$ cm$^{-3}$, 50 nanometers) composed of n-In$_{0.5}$Ga$_{0.5}$As, an extrinsic base layer 12a ($4 * 10^{20}$ cm$^{-3}$) composed of p-GaAs, an emitter electrode 13 composed of WSi, a base electrode 14 composed of Ti/Pt/Au, a collector electrode 15 composed of AuGe/Ni/Au, an electrode 16 composed of Ti/Pt/Au for taking out an emitter therethrough, a SiO$_2$ layer 17, 18, 19 and an insulation area 20.

In FIG. 1, the p-GaAs layer 12a is formed by selective regrowth using a metalorganic molecular beam epitaxy method (generally referred to as "MOMBE"). In the p-GaAs layer 12a, carbon, which is a p-type impurity, is doped heavily or in high density, and the intrinsic base layer 5b is formed to be uniform base structure.

On the other hand, in AlGaAs/GaAs HBT not using selective regrowth for forming an extrinsic base area unlike MOMBE, a p-AlGaAs graded layer is used as a base layer for shortening base transit time. The p-AlGaAs graded layer has continuous gradient with increasing concentration of Al from a base-collector junction towards a base-emitter junction. Since electrons, which are minority carriers, traveling across a base layer are accelerated by pseudo electric field in this base structure, this base structure can shorten a base transit time and enhance a current gain relative to the above mentioned uniform base structure in which electrons run in a base layer by diffusion effect.

It is necessary to prevent aluminum oxide from growing at a regrown interface between the intrinsic base layer 5b and the extrinsic base layer 12a, in order to reduce a base resistance in HBT in which an extrinsic base area is to be formed by regrowth as aforementioned. Accordingly, it is desirable to constitute an intrinsic area of a uniform base structure composed of GaAs, but undesirable to constitute an intrinsic area of a continuous gradient having base structure composed of an AlGaAs graded layer. Thus, it has been almost impossible conventionally to reduce a base resistance and also shorten a base transit time by means of the above mentioned regrowth method.

SUMMARY OF THE INVENTION

It is an object of the present invention to solve these problems, more specifically, to provide a heterojunction bipolar transistor (HBT) using a compound semiconductor therein, which transistor can reduce a base resistance and concurrently shorten a base transit time and thereby enhance high frequency performance.

In one aspect, the invention provides a bipolar transistor including an emitter layer at least a part of which is composed of AlGaAs, a collector layer at least a part of which is composed of GaAs, a base contact layer disposed in at least a part of an area between a base electrode and a base layer, and a base layer at least a part of which is composed of an InGaAs graded layer in which the concentration of In continuously varies.

The invention also provides a bipolar transistor including an emitter layer at least a part of which is composed of AlGaAs, a collector layer at least a part of which is conposed of GaAs, a base contact layer disposed in at least a part of an area between a base electrode and a base layer, and a base layer at least a part of which is composed of an InGaAs graded layer in which continuous gradient with either an increasing or decreasing concentration of In is formed.

The invention further provides a bipolar transistor including an emitter layer at least a part of which is composed of AlGaAs, a collector layer at least a part of which is composed of GaAs, a base contact layer disposed in at least a part of an area between a base electrode and a base layer, and a base layer at least a part of which is composed of an InGaAs graded layer in which the concentration of In gradually increases from an emitter-base junction towards a base-collector junction.

In another aspect, the invention provides a bipolar transistor including an emitter layer at least a part of which is composed of AlGaAs, a collector layer at least a part of which is composed of GaAs, an extrinsic base layer formed in at least a part of an extrinsic base area, and a base layer at least a part of which in an intrinsic area is composed of an InGaAs graded layer in which the concentration of In continuously varies.

The invention also provides a bipolar transistor including an emitter layer at least a part of which is composed of AlGaAs, a collector layer at least a part of which is composed of GaAs, an extrinsic base layer formed in at least a part of an extrinsic base area, and a base layer at least a part of which in an intrinsic area is composed of an InGaAs graded layer in which continuous gradient with either an increasing or decreasing concentration of In is formed.

The invention also provides a bipolar transistor including an emitter layer at least a part of which is composed of AlGaAs, a collector layer at least a part of which is composed of GaAs, an extrinsic base layer formed in at least a part of an extrinsic base area, and a base layer at least a part of which in an intrinsic area is composed of an InGaAs graded layer in which the concentration of In gradually increases from an emitter-base junction towards a base-collector junction.

In a preferred embodiment, the extrinsic base layer is formed by regrowth.

In another preferred embodiment, the concentration of In at the emitter-base junction is zero (0).

In still another preferred embodiment, the InGaAs is represented with $In_xGa_{1-x}As$, and the concentration of In therein is varied in the range of 0 to x.

In still another aspect, the present invention provides a method of fabricating the above mentioned heterojunction bipolar transistor. The method includes the steps of:

(a) forming on a semi-insulating substrate composed of GaAs, first and second layers each composed of n-GaAs, a third layer comprising an n-$In_xGa_{1-x}As$ graded layer (x is varied in the range of 0 to 0.1), a fourth layer comprising a p-$In_xGa_{1-x}As$ graded layer (x is varied in the range of 0.1 to 0), a fifth layer comprising an n-$Al_xGa_{1-x}As$ graded layer (x is varied in the range of 0 to 0.25), a sixth layer comprising an n-$Al_{0.25}Ga_{0.75}As$ graded layer, a seventh layer comprising an n-$Al_xGa_{1-x}As$ graded layer (x is varied in the range of 0.25 to 0), a eighth layer comprising an n-GaAs layer, a ninth layer comprising an n-$In_xGa_{1-x}As$ graded layer (x is varied in the range of 0 to 0.5), and a tenth layer an n-$In_{0.5}Ga_{0.5}As$ layer in this order, (b) forming a WSi layer all over the layer-laminated structure, and also forming a $SiO_2$ layer on the WSi layer, (c) etching the WSi layer, the $SiO_2$ layer, the tenth layer, the ninth layer, the eighth layer, the seventh layer and a part of the sixth layer to form an emitter mesa by means of a desirably patterned mask, (d) etching the sixth layer, the fifth layer and the fourth layer for removing an area thereof other than an area for forming therein an intrinsic area and a base electrode, (e) depositing a $SiO_2$ layer all over the resultant, (f) etching the $SiO_2$ layer by means of a desirably patterned mask to thereby form an opening to an extrinsic base area while forming a side wall composed of the $SiO_2$ layer at the side of the emitter mesa, (g) etching the sixth layer and fifth layer to remove these layers at an area in which the opening is formed, to thereby expose a surface of the fourth layer while forming a heterostructure-guard-ring composed of AlGaAs at an edge of the emitter mesa, (h) forming a base contact layer on the fourth layer by selectively growing p-GaAs layer using MOMBE method, (i) forming an insulating area by $H^+$ implantation, (j) forming a base electrode composed of Ti/Pt/Au by means of a desirably patterned mask, (k) etching the $SiO_2$ layer, the third and second layers by means of a desirably patterned mask to thereby form an opening to the collector area and expose the first layer, (l) forming a collector electrode composed of AuGe/Ni/Au, (m) depositing an $SiO_2$ layer, (n) etching the $SiO_2$ layer by means of a desirably patterned mask to remove a part of the $SiO_2$ layer disposed above a location where an emitter electrode is to be formed, to thereby expose the WSi layer, and (o) forming an emitter electrode composed of Ti/Pt/Au in an emitter area.

The advantages obtained by the aforementioned present invention will be described hereinbelow.

A base structure having continuous gradient of composition can be formed by using a p-InGaAa graded layer in place of a p-AlGaAs graded layer. For instance, $In_{0.1}Ga_{0.9}As$ has a bandgap which is smaller by 0.156 eV than that of GaAs. Accordingly, if a p-InGaAs graded layer is used as a base layer, which p-InGaAs graded layer has 40 nm thickness and also has continuous gradient of concentration of In decreasing in the range of 0.1 through 0 from a base-collector junction towards an emitter-base junction, it is possible to form a continuous gradient base structure having pseudo electric field with an intensity of approximately 40 KeV at the side of a conductive band. Thus, it is possible to shorten a base transit time of electrons, specifically a time for electrons to travel across a base layer. In addition, since aluminum (Al) is not present in a base layer in the above mentioned base structure, it is possible to prevent aluminum oxide from growing at a regrown interface when an extrinsic base area is to be formed by regrowth. Thus, it is possible to obtain a regrown interface which improves electrical connection.

In other words, using an InGaAs graded layer as a base layer of an intrinsic area and forming a semiconductor layer heavily doped with impurities by a regrowth method as an extrinsic base layer or a base contact layer make it possible both to reduce a base resistance and shorten a base transit time.

If an emitter is composed of AlGaAs and a collector is composed of GaAs, an InGaAs base layer has a lattice inconsistency. However, suitable control of the relationship between the concentration of In included in a base layer and a thickness of the base layer can depress the occurrence of lattice defect such as misfit dislocation.

In addition, if a collector is composed of GaAs, an energy barrier is formed at a base-collector junction between the collector and an InGaAs base layer. If such an energy barrier is present, a flow of carriers is interrupted and thereby a transistor performance is deteriorated. However, such an energy barrier can be eliminated by forming at a base-collector junction and at the side of a collector layer, an InGaAs graded layer having continuous gradient of the concentration of In gradually decreasing towards a substrate contrary to the continuous gradient in the base layer.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

A preferred embodiment in accordance with the invention will be explained hereinbelow with reference to drawings.

Figure 1:
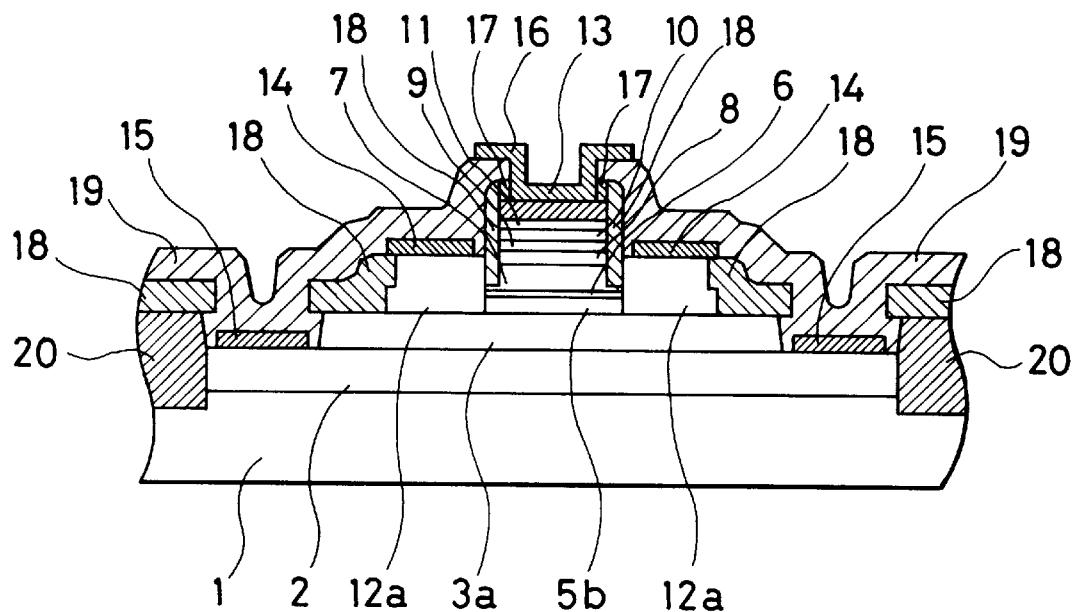
FIG. 1 is a cross-sectional view of a semiconductor chip suitable for use of a conventional bipolar transistor.
Figure 2:
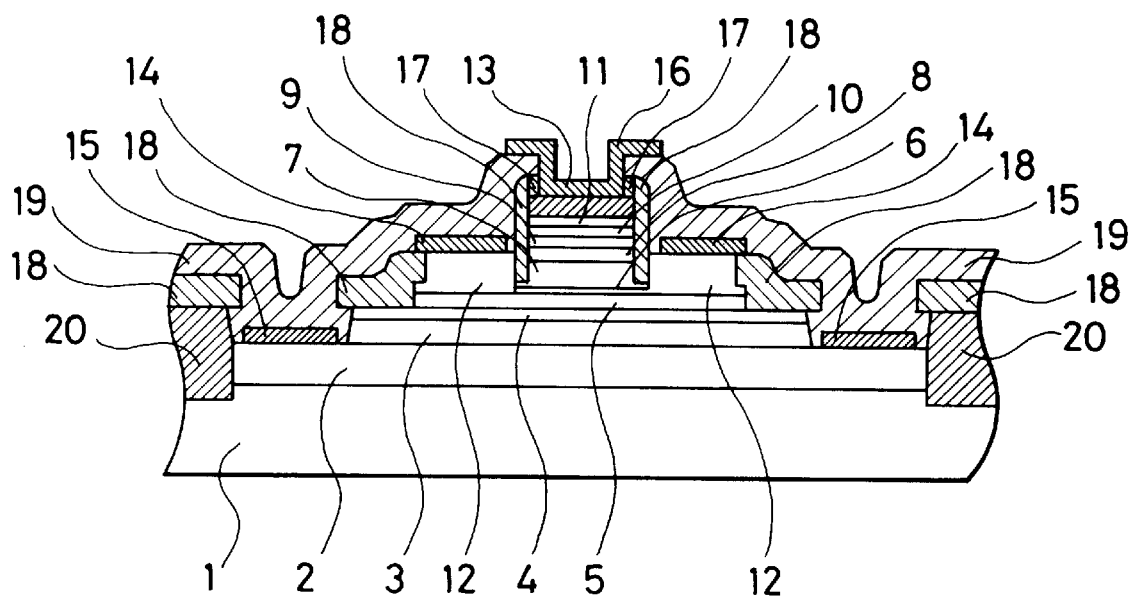
FIG. 2 is a cross-sectional view of a semiconductor chip for use of a first embodiment of a bipolar transistor in accordance with the present invention.

FIG. 2 illustrates a cross section of a semiconductor chip for use of a first embodiment in accordance with the invention. The semiconductor chip includes a semi-insulating substrate 1 composed of GaAs, a collector contact layer 2 ($3 * 10^{18}$ cm$^{-3}$, 400 nanometers) composed of n-GaAs, a first collector layer 3 ($5 * 10^{16}$ cm$^{-3}$, 460 nanometers) of n-GaAs, a second collector layer 4 ($5 * 10^{16}$ cm$^{-3}$, 40 nanometers) composed of an n-In$_x$Ga$_{1-x}$As graded layer (x is varied in the range of 0 to 0.1), a base layer 5 ($6 * 10^{19}$ cm$^{-3}$, 40 nanometers) composed of a p-In$_x$Ga$_{1-x}$As graded layer (x is varied in the range of 0.1 to 0), an emitter graded layer 6 ($3 * 10^{17}$ cm$^{-3}$, 20 nanometers) composed of n-Al$_x$Ga$_{1-x}$As (x is varied in the range of 0 to 0.25), an emitter layer 7 ($3 * 10^{17}$ cm$^{-3}$, 150 nanometers) composed of n-Al$_{0.25}$Ga$_{0.75}$As, a graded layer 8 ($3 * 10^{17}$ through $6 * 10^{18}$ cm$^{-3}$, 50 nanometers) composed of n-Al$_x$Ga$_{1-x}$As (x is varied in the range of 0.25 to 0), a n-GaAs layer 9 ($6 * 10^{18}$ cm$^{-3}$, 120 nanometers), a graded layer 10 ($2 * 10^{19}$ cm$^{-3}$, 50 nanometers) composed of n-In$_x$Ga$_{1-x}$As (x is varied in the range of 0 to 0.5), an emitter contact layer 11 ($2 * 10^{19}$ cm$^{-3}$, 50 nanometers) composed of n-In$_{0.5}$Ga$_{0.5}$As, a base contact layer 12 ($4 * 10^{20}$ cm$^{-3}$, 300 nanometers) composed of p-GaAs, an emitter electrode 13 composed of WSi, a base electrode 14 composed of Ti/Pt/Au, a collector electrode 15 composed of AuGe/Ni/Au, an electrode 16 composed of Ti/Pt/Au for taking out an emitter therethrough, a SiO$_2$ layer 17, 18, 19 and an insulation area 20.

In the semiconductor chip illustrated in FIG. 2, the p-GaAs layer 12 is selectively grown by MOMBE process and is heavily doped with a carbon (C) which is a p-type impurity. It should be noted that it is quite important that a base structure having continuous gradient of the concentration of In is formed without including aluminum oxide at a regrown interface between the base layer 5 and the base contact layer 12 by virtue of the base layer 5 comprising an InGaAs graded layer.

Hereinbelow is explained a method of fabricating the above mentioned bipolar transistor with reference to FIGS. 3 to 6.

Figure 3:
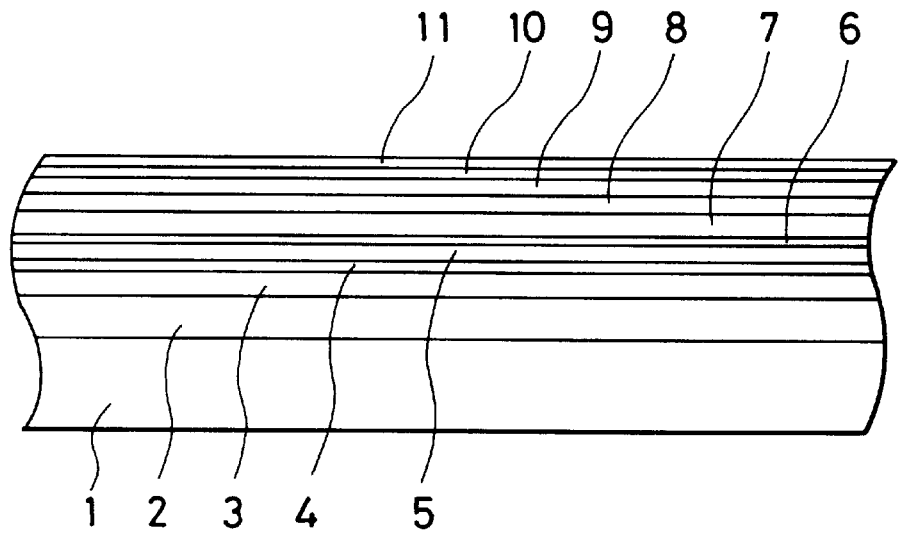
FIG. 3 is a cross-sectional view of a semiconductor chip under one of steps of a method for fabricating a bipolar transistor as illustrated in FIG. 2.

First, as illustrated in FIG. 3, there are deposited on the semi-insulating substrate 1 by means of a metalorganic molecular beam epitaxy process (hereinafter referred to as "MOMBE"), n-GaAs layers 2 and 3, an n-In$_x$Ga$_{1-x}$As graded layer 4 (x is varied in the range of 0 to 0.1), a p-In$_x$Ga$_{1-x}$As graded layer 5 (x is varied in the range of 0.1 to 0), an n-Al$_x$Ga$_{1-x}$As graded layer 6 (x is varied in the range of 0 to 0.25), an n-Al$_{0.25}$Ga$_{0.75}$As layer 7, an n-Al$_x$Ga$_{1-x}$As graded layer 8 (x is varied in the range of 0.25 to 0), an n-GaAs layer 9, an n-In$_x$Ga$_{1-x}$As graded layer 10 (x is varied in the range of 0 to 0.5), and an n-In$_{0.5}$Ga$_{0.5}$As layer 11. Silicon (Si) and beryllium (Be) are used as n-type impurity and p-type impurity respectively.

Figure 4:
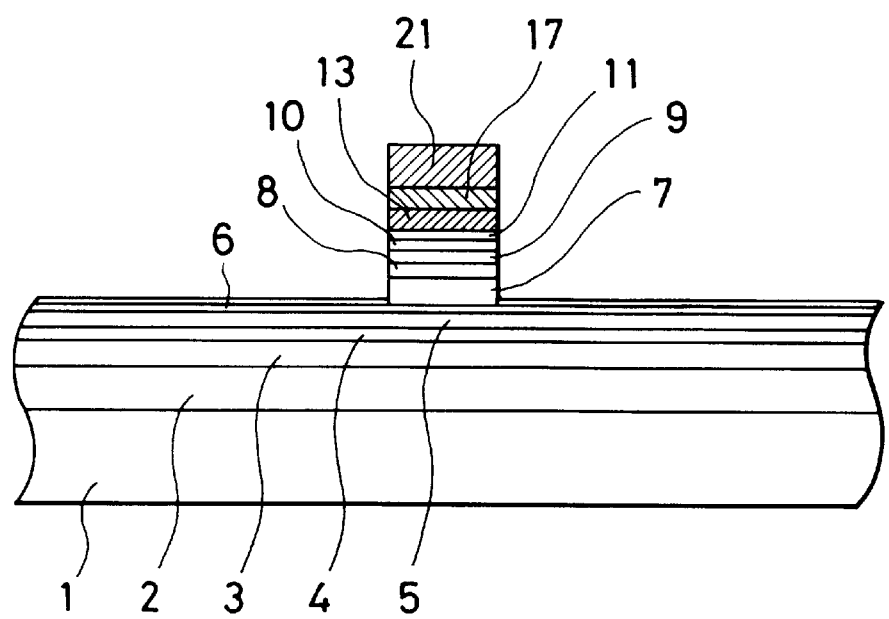
FIG. 4 is a cross-sectional view of a semiconductor chip under another step of a method for fabricating a bipolar transistor as illustrated in FIG. 2.
Figure 5:
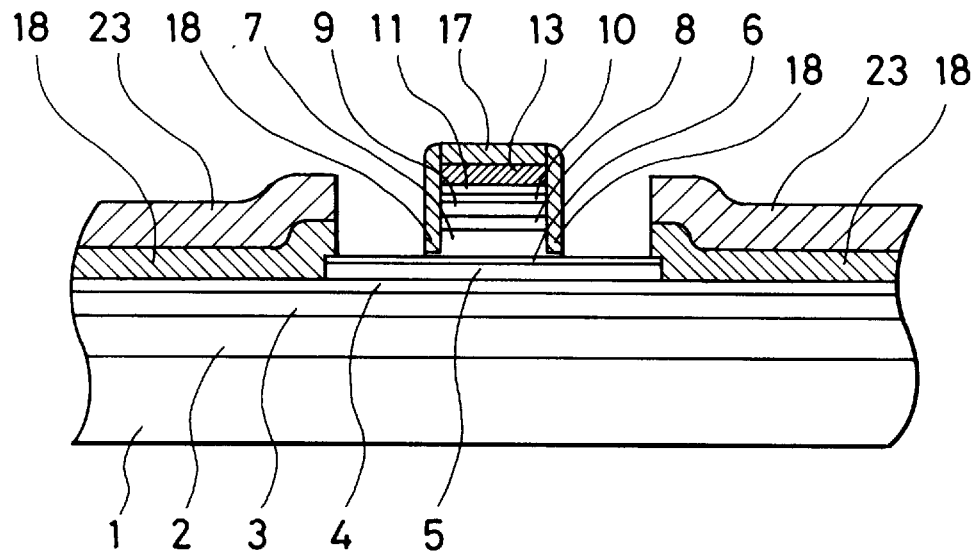
FIG. 5 is a cross-sectional view of a semiconductor chip under still another step of a method for fabricating a bipolar transistor as illustrated in FIG. 2.

Then, as illustrated in FIG. 4, a WSi layer 13 is deposited all over the n-In$_{0.5}$Ga$_{0.5}$As layer 11 and further a SiO$_2$ layer 17 is deposited on the WSi layer 13. Then, the SiO$_2$ layer 17 and the WSi layer 13 are etched by a reactive ion etching process using a desirably patterned photo resist layer 21 as a mask, and subsequently the n-In$_{0.5}$Ga$_{0.5}$As layer 11, the n-In$_x$Ga$_{1-x}$As graded layer 10, the n-GaAs layer 9, the n-Al$_x$Ga$_{1-x}$As graded layer 8, and the n-Al$_{0.25}$Ga$_{0.75}$As layer 7 are etched by a reactive ion beam etching process. The n-Al$_{0.25}$Ga$_{0.75}$As layer 7 is not etched through its entire thickness, but only etched through a part of its thickness. Thus, an emitter mesa is formed.

Then, the photo resist layer 21 is removed. Using a desirably patterned photo resist layer (not shown) as a mask, the n-Al$_{0.25}$Ga$_{0.75}$As layer 7, the n-Al$_x$Ga$_{1-x}$As graded layer 6 and the p-In$_x$Ga$_{1-x}$As graded layer 5 are in sequence removed by means of a wet etching process in an area other than area for forming therein an element intrinsic area and a base electrode. The photo resist (not shown) is removed, and thereafter a SiO$_2$ layer 18 is deposited. Then, a desirably patterned photo resist layer 23 is formed on the SiO$_2$ layer 18, and subsequently the SiO$_2$ layer 18 is removed by a reactive ion etching process using the photo resist layer 23 as a mask. Thus, an extrinsic base area is opened and concurrently a side wall composed of the SiO$_2$ layer 18 is formed around the side surfaces of the emitter mesa.

Figure 6:
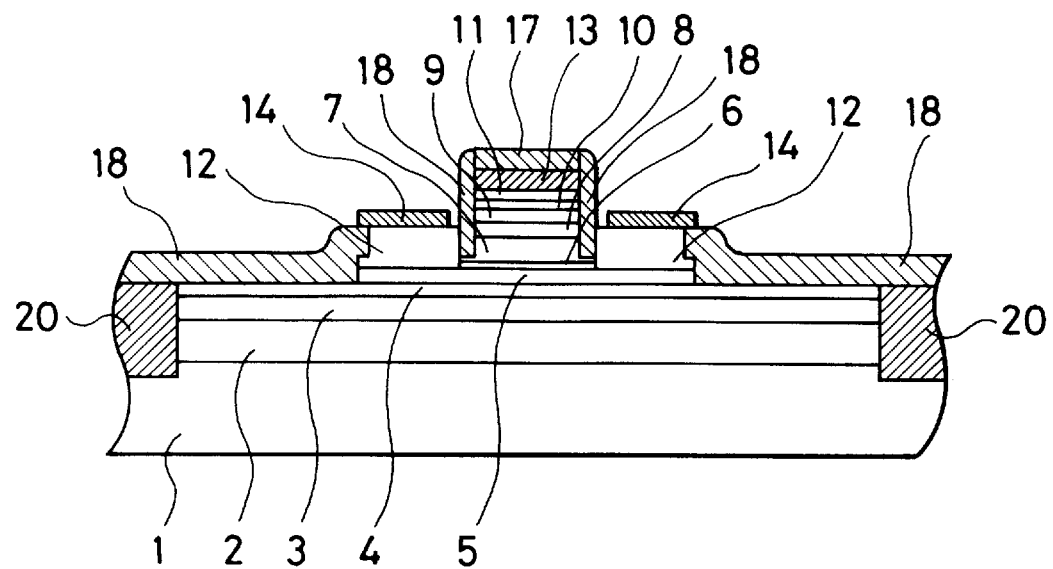
FIG. 6 is a cross-sectional view of a semiconductor chip under yet another step of a method for fabricating a bipolar transistor as illustrated in FIG. 2.

Then, the photo resist 23 is removed, and subsequently, as illustrated in FIG. 6, the n-Al$_{0.25}$Ga$_{0.75}$As layer 7 and the n-Al$_x$Ga$_{1-x}$As graded layer 6 located in the opened area are removed out by etching. Thus, the p-In$_x$Ga$_{1-x}$As graded layer 5 is exposed, and a heterostructure-guard-ring composed of AlGaAs is formed at an edge of the emitter mesa. Subsequently, on the p-In$_x$Ga$_{1-x}$As graded layer 5 at the opening area, a p-GaAs layer 12 is selectively grown by MOMBE process to thereby form a base contact layer. In this case, trimethyl gallium (TMG) and solid arsenic (As) are used for growth of the layer 12. The growth temperature was 450 degrees centigrade. Then, after H$^+$ ion is implanted for separating elements from each other to thereby form an insulating area 20, a base electrode 14 composed of Ti/Pt/Au is formed by lift off using a photo resist layer (not shown) having a predetermined pattern.

Then, using a desirably patterned photo resist layer (not shown) as a mask, the SiO$_2$ layer 18, the n-In$_x$Ga$_{1-x}$As graded layer 4 and n-GaAs layer 3 are removed in sequence by wet etching to thereby open a collector area and expose the n-GaAs layer 2. Thereafter, a collector electrode 15 composed of AuGe/Ni/Au is formed by lift off. An SiO$_2$ layer 19 is deposited all over the entire surface of thus fabricated structure. Then, using a desirably patterned photo resist layer (not shown) as a mask, the SiO$_2$ layers 17 and 19 located above the emitter electrode are removed by reactive ion etching, to thereby expose the WSi layer 13. Finally, a desirably patterned electrode for taking an emitter therethrough, composed of Ti/Pt/Au is formed in an opened emitter area. Thus, a bipolar transistor as illustrated in FIG. 2 is fabricated.

The test was conducted on the bipolar transistor fabricated as aforementioned for evaluating a transistor performance. The current gain is over 90. In addition, the maximum value of the current gain cutoff frequency $f_T$ and the maximum oscillation frequency $f_{max}$ is 102 GHz and 224 GHz respectively, which are quite improved with respect to static characteristic and high frequency characteristic relative to conventional transistors. In addition, since a base-collector junction as well as an emitter-base junction is formed of a heterojunction, a base push-out effect can be depressed more effectively than conventional transistors, whereby it is possible to operate the bipolar transistor in accordance with the invention in higher current density and thereby enhance its performance.

Figure 7:
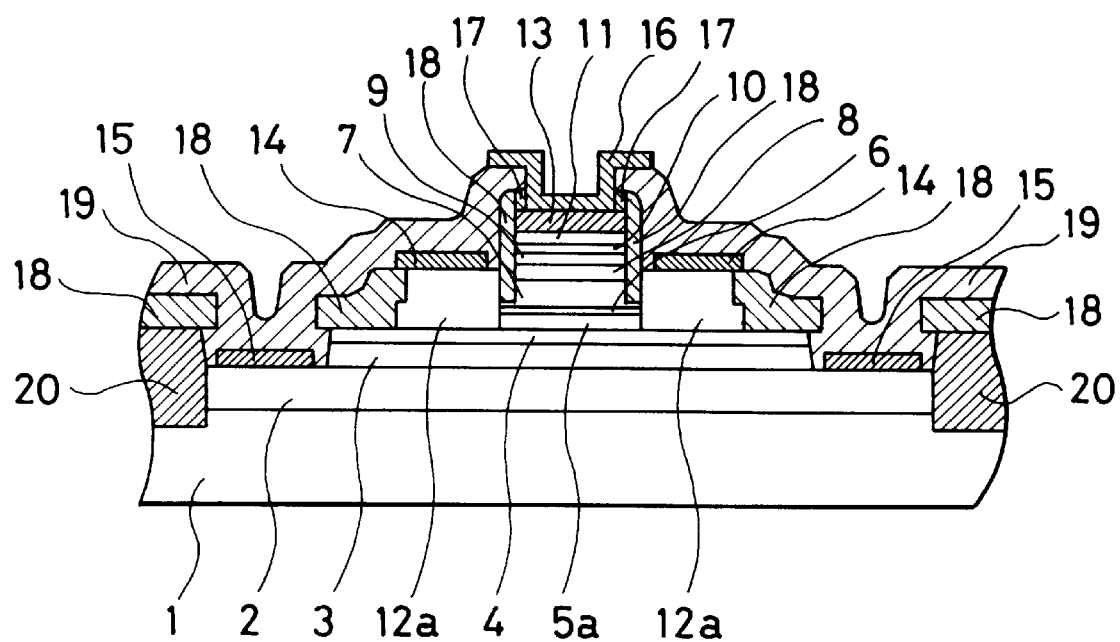
FIG. 7 is a cross-sectional view of a semiconductor chip for use of a second embodiment of a bipolar transistor in accordance with the present invention.

FIG. 7 is a cross-sectional view of a semiconductor chip suitable for use of a second embodiment in accordance with the invention. In the illustrated embodiment, a p-GaAs layer 12a (4 * $10^{20}$ cm$^{-3}$, 350 nanometers) works as an extrinsic base layer, and is horizontally and electrically connected to a p-In$_x$Ga$_{1-x}$As graded layer 5a (x is varied in the range of 0.1 through 0) working as an intrinsic base layer. The illustrated semiconductor chip has the same structure as the first embodiment mentioned with reference to FIGS. 2 to 6 except the above mentioned point. The illustrated semiconductor chip is fabricated in accordance with the method according to which the first embodiment was fabricated, except the following. Namely, in this second embodiment, the p-In$_x$Ga$_{1-x}$As graded layer 5 as well as the n-Al$_{0.25}$Ga$_{0.75}$As graded layer 7 and the n-Al$_x$Ga$_{1-x}$As graded layer 6 is removed by wet etching after the extrinsic base area has been opened, and then the p-GaAs extrinsic base layer 12a is formed on the n-In$_x$Ga$_{1-x}$As graded layer 4.

The test was conducted on the bipolar transistor fabricated in accordance with the aforementioned second embodiment for evaluating a transistor performance. Similarly to the first embodiment, the transistor indicated highly improved static characteristic and high frequency characteristic relative to conventional transistors.

In the above mentioned first and second embodiments, the base contact layer or the extrinsic base layer is formed by selective regrowth using MOMBE process. However, it should be noted that the present invention is not limited to this case. The present invention may be applied to a case in which the base contact layer or the extrinsic base layer is regrown by selective growth process such as MOCVD process or non-selective crystal growth process such as MBE process. The latter case also provides similar advantageous improvements as aforementioned.

In the first and second embodiments, beryllium (Be) was used as the p-type impurities in the base layer constituting the intrinsic area. However, the present; invention is not limited to that. In the present invention, other p-type impurities such as a carbon (C) and a zinc (Zn) can be employed. The similar advantageous improvements as aforementioned can be obtained in those cases.

The base contact layer or the extrinsic base layer formed by regrowth is composed of GaAs in the first and second embodiments, however, the present invention is not limited thereto. The base contact layer or the extrinsic base layer may be composed of other semiconductor material such as InGaAs on the condition that the material includes impurities in high concentration.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A bipolar transistor comprising:

a compound semiconductor substrate comprising GaAs;

a collector contact layer on said substrate and comprising GaAs;

a first collector layer on said collector contact layer, said first collector layer comprising GaAs of uniform structure and a first conductivity type;

a second collector layer on said first collector layer, said second collector layer comprising In$_x$Ga$_{1-x}$As of graded structure and said first conductivity type;

a base layer on said second collector layer, said base layer comprising In$_x$Ga$_{1-x}$As of graded structure and a second conductivity type;

a first emitter graded layer on said base layer, said first emitter graded layer comprising Al$_x$Ga$_{1-x}$As of graded structure and said first conductivity type;

a base contact layer contacting said base layer and that is adjacent said first emitter graded layer, said base contact layer comprising GaAs of uniform structure and said second conductivity type; and a second emitter graded layer comprising InGaAs and provided on an opposite side of said first emitter graded layer from said base layer and in contact with an emitter contact layer which comprises InGaAs whereby an oxide is not formed between said base contact layer and said base layer, and whereby a resistance of said base layer and a transit time across said base layer are reduced.

2. The transistor of claim 1, wherein said first collector layer is at least ten times thicker than said second collector layer.

3. The transistor of claim 1, wherein said base contact layer contacts an upper surface of said base layer and a side of said first emitter graded layer.

4. The transistor of claim 1, wherein said base contact layer contacts a side of said base layer and a side of said first emitter graded layer.

5. The transistor of claim 1, wherein said base layer is an intrinsic base layer.

6. A bipolar transistor comprising:

a compound semiconductor substrate comprising GaAs;

a collector contact layer on said substrate comprising GaAs;

a first collector layer on said collector contact layer, said first collector layer comprising GaAs of uniform structure and a first conductivity type;

a second collector layer on said first collector layer, said second collector layer comprising In$_x$Ga$_{1-x}$As of graded structure and said first conductivity type;

a base layer on said second collector layer, said base layer comprising In$_x$Ga$_{1-x}$As of graded structure and a second conductivity type;

a first emitter graded layer on said base layer, said first emitter graded layer comprising Al$_x$Ga$_{1-x}$As of graded structure and said first conductivity type;

a base contact layer contacting said base layer and that is adjacent said first emitter graded layer, said base contact layer comprising GaAs of uniform structure and said second conductivity type;

a second emitter graded layer comprising InGaAs and provided on an opposite side of said first emitter graded layer from said base layer and in contact with an emitter contact layer which comprises InGaAs;

a concentration of Al in said first emitter graded layer continuously decreasing from adjacent said emitter contact layer toward an emitter-base junction; and a concentration of In in said second emitter graded layer continuously decreasing from adjacent the emitter-base junction toward said emitter contact layer, whereby an oxide is not formed between said base contact layer and said base layer, and whereby a resistance of said base layer and a transit time across said base layer are reduced.

7. The transistor of claim 6, wherein said base layer is an intrinsic base layer.

* * * * *